(12) United States Patent
Oue et al.

(10) Patent No.: US 6,956,255 B2
(45) Date of Patent: Oct. 18, 2005

(54) SEMICONDUCTOR DEVICE AND DRIVE CIRCUIT USING THE SEMICONDUCTOR DEVICES

(75) Inventors: Eiji Oue, Ome (JP); Katsuyoshi Washio, Tokorozawa (JP); Masao Kondo, Higashimurayama (JP); Hiromi Shimamoto, Iruma (JP)

(73) Assignees: Renesas Technology Corp., Tokyo (JP); Hitachi Device Engineering Co., Ltd., Mobara (JP)

( * ) Notice: Subject to any disclaimer, the term of this patent is extended or adjusted under 35 U.S.C. 154(b) by 0 days.

(21) Appl. No.: 10/289,306

(22) Filed: Nov. 7, 2002

(65) Prior Publication Data

US 2003/0057523 A1 Mar. 27, 2003

Related U.S. Application Data

(63) Continuation of application No. 10/067,233, filed on Feb. 7, 2002, now Pat. No. 6,501,153.

(30) Foreign Application Priority Data

Mar. 14, 2001 (JP) ........................................ 2001-071773

(51) Int. Cl.[7] .................. H01L 29/80; H01L 39/112
(52) U.S. Cl. ...................................... 257/276; 257/707
(58) Field of Search ................................. 257/622, 625, 257/276, 706, 707

(56) References Cited

U.S. PATENT DOCUMENTS

| 3,986,196 A | * | 10/1976 | Decker et al. |
| 4,794,093 A | * | 12/1988 | Tong et al. |
| 5,313,094 A | * | 5/1994 | Beyer et al. |
| 6,222,254 B1 | * | 4/2001 | Liang et al. |
| 6,355,950 B1 | * | 3/2002 | Livengood et al. |

FOREIGN PATENT DOCUMENTS

| JP | 7-086298 | | 3/1995 |
| JP | 07-086298 | * | 3/1995 |

* cited by examiner

Primary Examiner—S. V. Clark
(74) Attorney, Agent, or Firm—Antonelli, Terry, Stout & Kraus, LLP

(57) ABSTRACT

A high-speed bipolar transistor is provided which is improved in the effect of heat radiation without increasing the substrate capacitance. The heat radiation connection between a base region and a silicon substrate includes a $p^+$ extrinsic base polysilicon electrode and a polysilicon layer buried in an isolation groove with a very thin silicon dioxide side wall. Accordingly, the heat generated at the base is radiated through this path to the silicon substrate. Further, the film thickness of the silicon dioxide on the inner wall of the isolation groove is sufficiently increased compared with previous structures to prevent an increase in the substrate capacitance. Consequently, there can be obtained a bipolar transistor which operates at high speed, and is improved in the effect of heat radiation without increasing the substrate capacitance.

19 Claims, 13 Drawing Sheets

SEMICONDUCTOR DEVICE AND DRIVE CIRCUIT USING THE SEMICONDUCTOR DEVICES

This is a continuation of application Ser. No. 10/067,233, filed Feb. 7, 2002 now U.S. Pat. No. 6,501,153, the entire disclosure of which is hereby incorporated by reference.

BACKGROUND OF THE INVENTION

1. Field of the Invention

The present invention relates to a semiconductor device using an SOI (Silicon On Insulator) substrate. More particularly, it relates to a high speed bipolar semiconductor device, and a drive circuit made up of the semiconductor devices.

2. Description of the Related Art

A bipolar transistor will be described as a prior-art example of a semiconductor device of an SOI structure. An example of this kind of bipolar transistor is disclosed in "A 6-$\mu m^2$ bipolar transistor using 0.25-$\mu m$ process technology for high-speed applications" (Bipolar/BiCMOS Circuits and Technology Meeting 1998 proceedings).

FIG. 2 shows a cross sectional view of the bipolar transistor described in the prior-art example.

In FIG. 2, a reference numeral 1 denotes a silicon substrate, 2 a buried silicon dioxide, 3 a silicon layer, 4 an $n^+$ buried layer, 5 an $n^-$ silicon epitaxial layer, 6 a field oxide, 7 an $n^+$ collector contact layer, 11 an isolation oxide, 14 a $p^+$ extrinsic base polysilicon electrode, 15, 18, and 22 silicon dioxides, 16 an intrinsic base layer, 17 a graft base, 19 an $n^+$ polysilicon sidewall, 20 an $n^+$ polysilicon emitter, 21 a single crystal silicon emitter, and 23, 24, 25 metal electrodes.

Further, as a second prior-art example, a part of the configuration disclosed in JP-A No. 86298/1995 is shown in FIG. 3. Some reference numerals are used in common with FIG. 2, and as other reference numerals, 12 denotes a polysilicon, and 30 a silicon dioxide.

In general, a semiconductor device generates heat during operation. Particularly, a bipolar transistor generates a large amount of heat, and radiates the heat to a silicon substrate. In recent years, an SOI (Silicon On Insulator) substrate with an insulating film buried therein has been used in place of a silicon bulk substrate aiming at reducing the substrate capacitance and merging complementary MOS therewith. The prior-art example as shown in FIG. 2 is a preferable example thereof. The thermal conductivity of the buried silicon dioxide 2 is about 1/100 as compared with silicon. Therefore, the generated heat is less likely to be radiated to the substrate as compared with the silicon bulk substrate, resulting in an increase in temperature in the transistor. Consequently, the change in the electrical characteristics of the transistor becomes remarkable.

Particularly, a hetero bipolar transistor using silicon-germanium as a base is reduced in current gain with an increase in temperature. This indicates the phenomenon that the electrical characteristics of the transistor differ according to the difference in density of the transistor arrangement, and the conditions of use. For this reason, a problem occurs that it is impossible to attain the performances as designed in a designed circuit. Further, the transistor is required to be used at high current for high-speed operation. Accordingly, the high-speed operation of the transistor is restricted in order to prevent the heat generation due to a current. Such a phenomenon holds true for not only the hetero bipolar transistor, but also semiconductor devices of an SOI structure such as a bipolar transistor using an SOI, a high-power MOS field effect transistor of an SOI structure, and a resistor used at a high current density.

As a means for solving the problem of heat radiation, for the bipolar transistor disclosed in the second prior-art example shown in FIG. 3, an isolation oxide 11 and a polysilicon 12 are buried in an isolation groove penetrating from a silicon substrate 1 to a buried silicon dioxide 2 and a silicon layer 3. As a result, the generated heat flows through the isolation oxide 11 to the polysilicon 12, and is radiated to the silicon substrate 1. In this case, the isolation oxide 11 is required to be reduced in film thickness in order to enhance the effect of heat radiation. However, if the isolation oxide 11 is reduced in thickness, the capacitance arising at the isolation groove portion of the substrate capacitance increases. Incidentally, the structure of the second prior-art example is a part of the one described in the JP-A No. 86298/1995. With this structure, heat radiation is carried out not through the silicon substrate, but at a heat radiation electrode through the groove in which a polysilicon is buried.

SUMMARY OF THE INVENTION

It is generally an object of the present invention to enhance the effect of heat radiation in a semiconductor device. In particular, it is an object to provide a bipolar semiconductor device which has been improved in effect of heat radiation without increasing the substrate capacitance, and operates at high speed. Further, it is another object of the present invention to provide an optical transmission system using the semiconductor devices.

The general outline of the present invention disclosed by this application will be described briefly below. Namely, a semiconductor device in accordance with the present invention is characterized in that the heat generated within the semiconductor device is led by a single crystal silicon or polysilicon layer, and radiated from the single crystal silicon or polysilicon to the silicon substrate through another single crystal silicon or polysilicon connected to the silicon substrate.

Below, a typical example of the present invention will be described briefly.

A bipolar transistor is characterized by having such a structure that an extrinsic single crystal silicon, or polysilicon base electrode is in contact with a single crystal silicon or polysilicon buried in an isolation groove, or an insulating film sufficiently thinner than the thickness of a field oxide is inserted in the interface therebetween. As a result, the heat generated in an intrinsic area passes through the extrinsic single crystal silicon or polysilicon base electrode having a thermal conductivity which is about 100 times that of a silicon dioxide, and radiated through the single crystal silicon or polysilicon in the isolation groove to the silicon substrate.

If this effect is combined with the effect of heat radiation through an insulating film on the inner sidewall of the isolation groove in the prior art, when the area of the emitter is about 0.2×1 $\mu m^2$, and the thickness of the silicon dioxide on the inner sidewall of the isolation groove is 0.2 $\mu m$, heat radiation is two times or more effective than the prior-art example. The effect becomes noticeable for a transistor formed with a more advanced submicron patterning. In other words, the effect becomes noticeable due to the following fact: the distance between the intrinsic area and the isolation groove is reduced, resulting in a decreased thermal resistance at the extrinsic base electrode. Further, since the surface area of the sidewall of the isolation groove is reduced, the thermal conductivity of heat passing through the sidewall is reduced. As a result, the thermal resistance at this portion is increased. Accordingly, the effect of heat radiation due to the structure of this application is further improved.

By reducing the thickness of the silicon dioxide buried in the isolation groove, it is also possible to improve the effect of heat radiation with the prior-art structure. However, when the thickness is reduced, the substrate capacitance arising through the silicon dioxide between the collector area and the silicon substrate is increased. On the other hand, with the structure of this application, silicon in the isolation groove is used as the path for heat radiation. Therefore, even if the thickness of the silicon dioxide buried in the isolation groove is increased, the reduction in the effect of heat radiation is ½ or less as compared with the prior-art structure. Accordingly, it is possible to sufficiently ensure the effect of heat radiation while inhibiting the increase in the substrate capacitance.

When the extrinsic base electrode and the silicon in the isolation groove are in direct contact with each other, the impurities in the extrinsic base electrode diffuse into the silicon in the isolation groove. However, the diffusion depth of the impurities due to the thermal budget in a normal high-performance bipolar transistor formation process is about 0.2 $\mu$m even when a polysilicon is used, and thus it will not be deeper than the field oxide thickness. When a single crystal silicon is used, the diffusion depth is shallower as compared with the polysilicon. The amount of increase in base-collector parasitic capacitance arising due to the diffusion of impurities is about 3% of the total base-collector parasitic capacitance, which is a negligible value.

If a consideration is given to the insulating property between the extrinsic base electrode and the silicon substrate, the resistance value of the silicon in the isolation groove is required to be 10 M$\Omega$ or more. In general, the resistivity is $10^4$ $\Omega$·cm or more for an undoped polysilicon. Whereas, it may be $10^3$ $\Omega$·cm or more even for a single crystal silicon. In this case, the resistance value between the extrinsic base electrode and the silicon substrate exhibits 1 M$\Omega$ or more even when a single crystal silicon is used. Therefore, the resistivity is required to be $10^3$ $\Omega$·cm or more from the viewpoint of the insulating property of this portion in either case where the silicon in the isolation groove is single crystalline or polycrystalline.

When the thermal processing in the transistor formation step is more often performed than normal, the impurities in the extrinsic base electrode diffusing into the silicon in the isolation groove increase in amount. In such a case, a thin insulating film becomes required to be inserted between the extrinsic base electrode and the silicon in the isolation groove. In this case, the effect of heat radiation varies according to the thickness of the insulating film. If the insulating film thickness is 10 nm, the effect of heat radiation is reduced by as much as twice that of a prior-art structure.

The current density passing through a transistor is expected to increase up to twice thereof in the future, and hence the effect of heat radiation is required to be twice the current effect of heat radiation. Therefore, it is considered desirable that the insulating film thickness is 10 nm or less.

For an MOS field effect transistor, heat is radiated from a single crystal silicon or polysilicon layer formed on a source or drain to the single crystal silicon or polysilicon in the isolation groove.

For a resistance element formed with a polysilicon, it is also possible to radiate heat directly from the resistor to the silicon in the isolation groove.

The same effects as illustrated in the description on the bipolar transistor are also exerted in the cases of the MOS field effect transistor and the resistor.

Other and further objects, features and advantages of the invention will appear more fully from the following description.

BRIEF DESCRIPTION OF THE DRAWINGS

A preferred form of the present invention illustrated in the accompanying drawings in which.

DETAILED DESCRIPTION OF THE PREFERRED EMBODIMENTS

Below, preferred embodiments of a semiconductor device and a manufacturing method thereof in accordance with the present invention will be described in detail by way of specific examples with reference to appended drawings.

EXAMPLE 1

Figure 1:
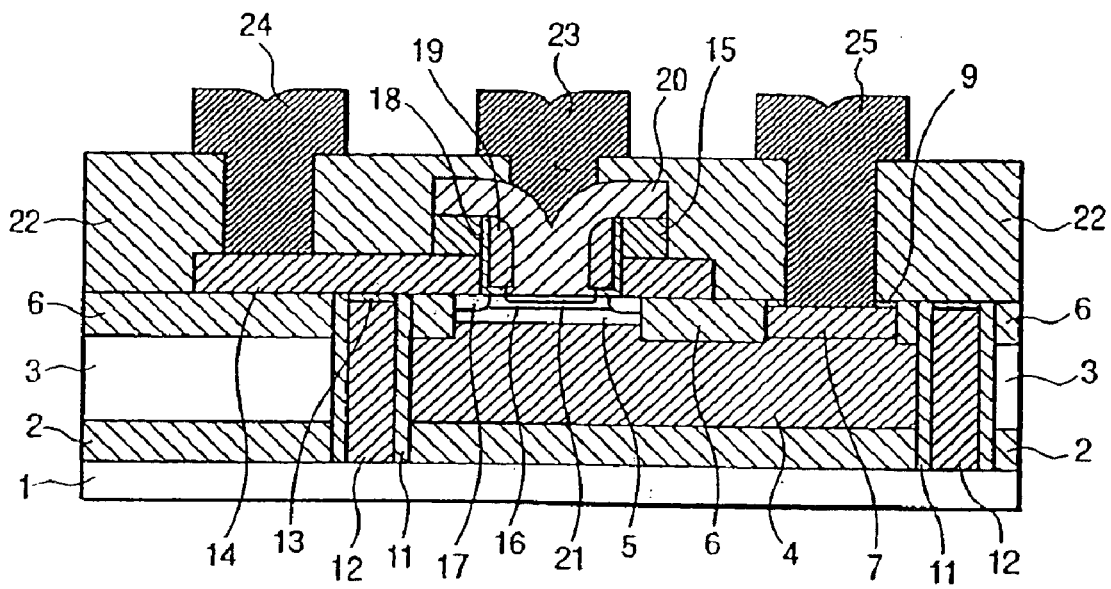
FIG. 1 is a cross sectional view of a semiconductor device of a first example in accordance with the present invention.
Figure 2:
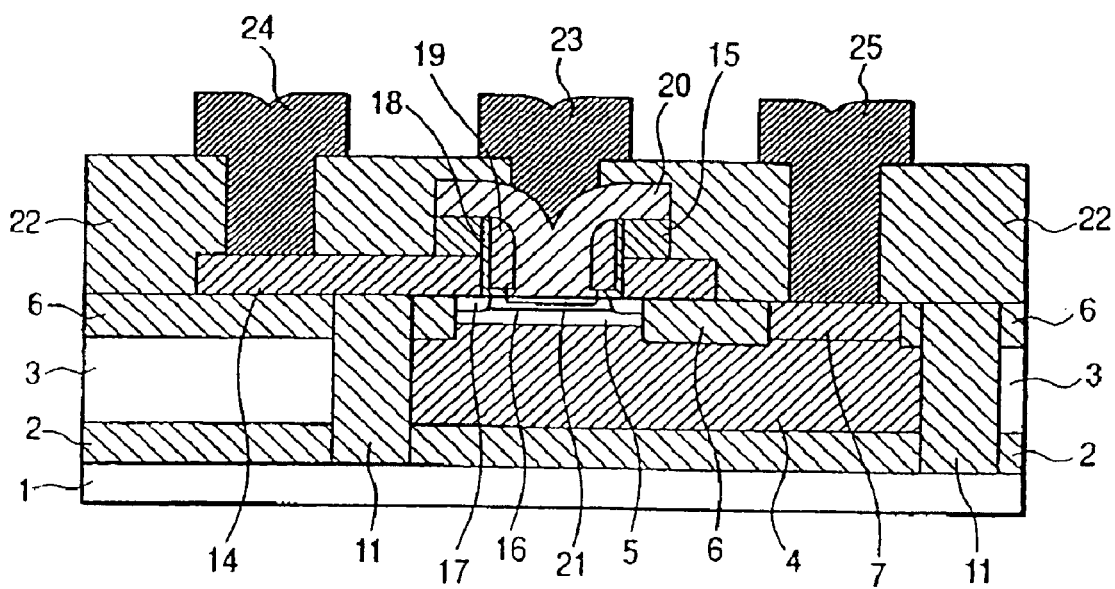
FIG. 2 is a cross sectional view for showing the configuration of a first prior-art bipolar transistor.

FIG. 1 shows a cross sectional view of a semiconductor device of a first example in accordance with the present invention In FIG. 1, a reference numeral 1 denotes a silicon substrate, 2 a buried silicon dioxide, 3 a single crystal silicon layer, 4 an n$^+$ buried layer, 5 an n$^-$ silicon epitaxial layer, 6 a field oxide, 7 an n$^+$ collector contact layer, 9, 13, 15, 18, and 22 silicon dioxides, 11 an isolation oxide, 12 a single crystal silicon or polysilicon, 14 a p$^+$ extrinsic base polysilicon electrode, 16 an intrinsic base layer, 17 a graft base, 19 an n$^+$ polysilicon sidewall, 20 an n$^+$ polysilicon emitter, 21 a single crystal silicon emitter, and 23, 24, and 25 emitter, base, and collector metal electrodes, respectively.

A manufacturing method of a bipolar semiconductor device having the structure of FIG. 1 of this example will be described step by step below by reference to FIGS. 4 to 8.

First, a step of forming the structure shown in FIG. 4 will be described.

The surface of the silicon substrate 1 is oxidized to form the silicon dioxide 2 having a film thickness of from about 0.3 to 0.5 $\mu$m. The silicon layer 3 is heated and bonded to the surface, and the silicon layer 3 is polished to a thickness of about 1 $\mu$m.

Then, n impurities are introduced into the silicon layer 3 by ion implantation using a photoresist mask through which an expected base area to an expected collector area are exposed to form the n$^+$ collector buried layer 4 by drive-in diffusion. Subsequently, the n collector layer 5 is formed by silicon epitaxial growth.

Thereafter, the surface of the n$^-$ collector layer 5 other than the base layer and the collector area is oxidized by using a LOCOS (Local Oxidation of Silicon) method to form a silicon dioxide 6 with a film thickness of about 0.4 $\mu$m. Alternatively, the silicon dioxide 6 may also be formed in the following manner. Namely, the n$^-$ collector layer 5 other than the base layer and the collector area is trenched to a depth of about 0.4 $\mu$m by a dry etching method, and a silicon dioxide is deposited thereon by a CVD (Chemical Vapor Deposition) method. Then, the silicon dioxide 6 is buried by using a CMP (Chemical Mechanical Polishing) method.

Thereafter, high-concentration n-impurity ions are implanted into only the expected collector area, and undergo drive-in diffusion to form a collector contact layer 7. Then, a silicon dioxide 8 and a silicon dioxide 9 are formed on the intrinsic area surface and the collector contact layer surface, respectively, and a silicon nitride 10 is formed on the entire surface. Consequently, the structure shown in FIG. 4 is obtained.

Figure 5:
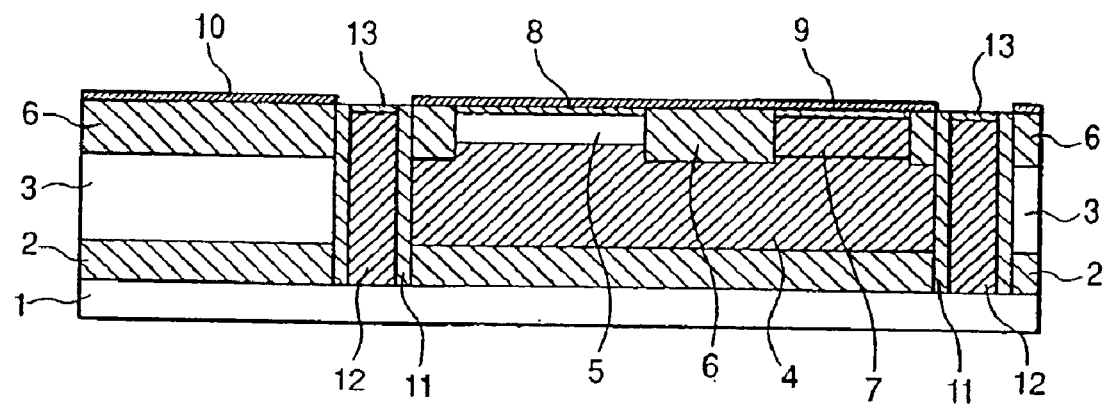
FIG. 5 is a cross sectional view of the semiconductor device in the subsequent step to the manufacturing step shown in FIG. 4.

Next, in order to obtain the structure of FIG. 5, a groove is formed from, the silicon dioxide 6 to the silicon substrate 1 by using a photoresist mask having an opening in groove form with a width of about 0.6 $\mu$m around the n$^+$ collector buried layer 4. Then, a silicon dioxide 11 with a thickness of about 0.2 $\mu$m is formed on the entire surface.

Then, the silicon dioxide side wall 11 is formed in the groove by dry etching. Further, a polysilicon 12 with a thickness of about 0.4 $\mu$m is formed on the entire surface. Then, the polysilicon exposed at the surface is removed by dry etching, so that the polysilicon 12 is buried in the groove. Alternatively, a single crystal silicon 12 may also be grown from the silicon substrate surface at the lower end of the groove by using selective epitaxy to be buried in the groove.

Then, the single crystal silicon or polysilicon 12 is oxidized to form a silicon dioxide 13 which is thicker than the silicon dioxide 8 by about 10 nm. The silicon dioxide 8 is removed by wet etching, so that the film thickness of the silicon dioxide 13 is 10 nm or less. Thereafter, a p$^-$ polysilicon layer 14 with a film thickness of 0.2 $\mu$m is deposited thereon, so that the silicon dioxide 13 with a thickness of 10 nm or less is present between the single crystal silicon or polysilicon 12 and the p$^+$ polysilicon layer 14. The p$^+$ polysilicon layer 14 may also be formed by depositing the polysilicon, and then implanting p-impurity ions thereinto.

Figure 6:
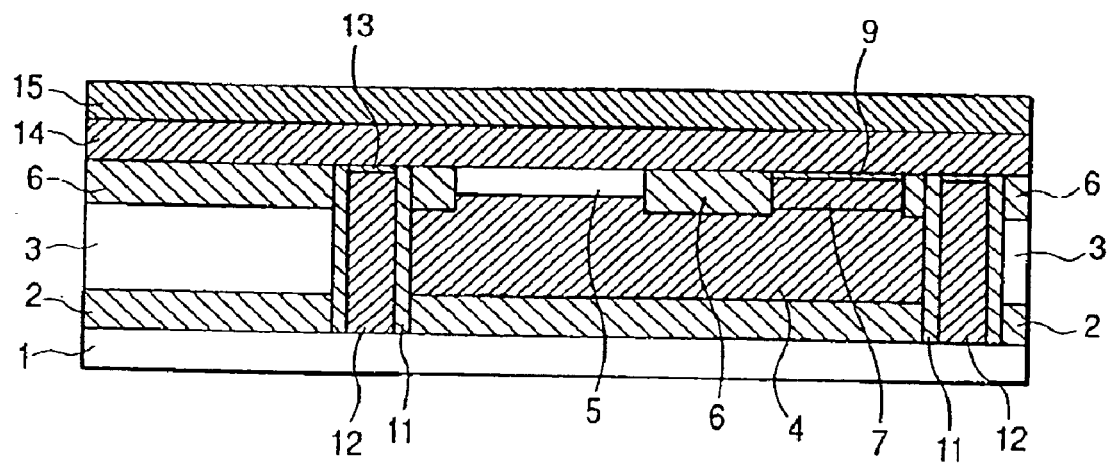
FIG. 6 is a cross sectional view of the semiconductor device in the subsequent step to the manufacturing step shown in FIG. 5.

Further, a silicon dioxide 15 with a film thickness of 0.2 $\mu$m is formed, resulting in the structure of FIG. 6.

Then, by using a photoresist mask having an opening overlying the expected base area, the silicon dioxide 15 and the p$^+$ polysilicon layer 14 are opened by dry etching. Boron ions are implanted into the windows, and thermal processing is performed. As a result, an intrinsic base layer 16 is formed, and a graft base 17 is formed by boron diffusion from the p$^+$ polysilicon layer 14, resulting in the structure shown in FIG. 7.

Then, a silicon dioxide 18 with a film thickness of 30 nm and an n$^+$ polysilicon 19 with a film thickness of 0.1 $\mu$m are successively deposited. The n$^+$ polysilicon sidewall 19 is formed by dry etching. The silicon dioxide 18 is etched by a hydrofluoric-acid until the intrinsic base layer 16 is exposed, and an n$^+$ polysilicon 20 with a film thickness of 0.2 µm is deposited. Dry etching is performed by using a resist mask having a pattern covering the emitter window to form a polysilicon emitter 20. Then, thermal processing is performed at 900° C. for about 30 seconds to diffuse n impurities from the polysilicon emitter 20 into the surface of the intrinsic base layer 16, thereby forming an emitter area 21.

Subsequently, the silicon dioxide 15 is etched. Further, the p$^+$ extrinsic base polysilicon electrode 14 is dry etched by using a resist mask having a pattern ranging from the periphery of the base area to the base electrode to form an extrinsic base polysilicon electrode 14. Consequently, the structure shown in FIG. 8 can be obtained.

Then, a silicon dioxide 22 is deposited and planarized. By using a photoresist mask having openings corresponding to an emitter, a base, and a collector, the silicon dioxide 22 is opened by dry etching.

Finally, tungsten is buried in the windows to form an emitter electrode 23, a base electrode 24, and a collector electrode 25. Consequently, the structure of the semiconductor device of this example shown in FIG. 1 can be obtained.

With this structure, it becomes possible to radiate the heat generated in the vicinity of the intrinsic base layer 16 to the silicon substrate 1 through the p$^+$ extrinsic base polysilicon electrode 14 and the single crystal silicon or polysilicon 12.

Figure 3:
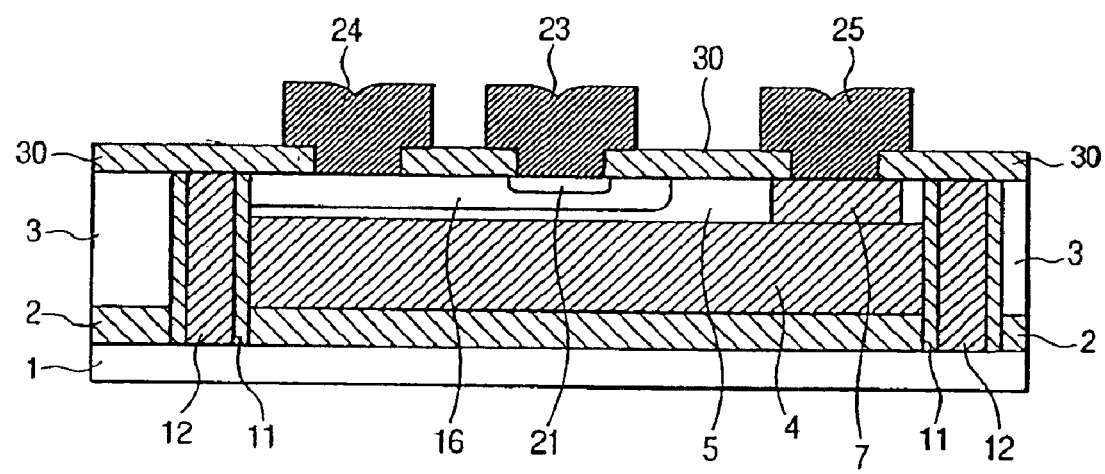
FIG. 3 is a cross sectional view for showing the configuration of a second prior-art bipolar transistor.

In the preceding technology shown in FIG. 3, the silicon dioxide layer 30, which contacts the silicon or polysilicon 12, scarcely has any function of heat transfer due to its material characteristics. Accordingly, the thickness of silicon dioxide 11 must be reduced to improve the effect of heat radiation in this structure. However, when the thickness is reduced, the substrate capacitance arising through the silicon dioxide 11 between collector area 4 and the silicon substrate 1 is increased, as described above. On the other hand, with the structure of the present invention FIG. 1, not only the silicon or polysilicon 12 but also based electrode 14 is used as the path for heat radiation. The base electrode 14 has characteristics of good thermal conductivity. Therefore, even if the thickness of the silicon dioxide 11 is increased, the reduction in the effect of heat radiation is ½ or less as compared with the structure of FIG. 3 due to the thermal path with the base electrode 14.

Accordingly, heat radiation becomes two times or more effective than the prior-art structure. This also allows operation even at high current in a high-speed bipolar transistor of an SOI structure aiming at a low substrate capacitance.

In accordance with another feature of the present invention, if thermal processing in the transistor formation steps is frequently performed an insulating layer 13 may be inserted between the base electrode 14 and the silicon or polysilicon 12 in order to prevent impurities from diffusing from the base electrode 14 to the silicon or polysilicon 12. In addition, the insulating layer 13 serves to help prevent a short circuit between the base electrode 14 and the silicon substrate 1. Since the resistivity of silicon dioxide is $10^{14}$–$10^{16}$ Ωcm, as is generally known, and the thickness of the insulating layer is about 10 nm, the total resistance value of the insulating layer 13 is as follows:

$$(1e14\sim1e16)*0.01e^{-4}/((0.2\sim0.6e^{-4})*(10\sim16e^{-4}))>1e15\Omega.$$

Therefore, the insulating layer 13 assists in the function of preventing a short circuit. Of course, since the resistance value of the isolation groove is 1 M Ω (=$10^6$ Ω) or higher, this generally would be enough to prevent a short circuit as described above.

On the other hand, if the resistance value of the silicon or polysilicon 12 in the isolation groove is reduced, or insufficiently high enough to prevent a short circuit in a particular instance, the insulating layer 13 can ensure that such a short circuit is, in fact, avoided.

EXAMPLE 2

Figure 9:
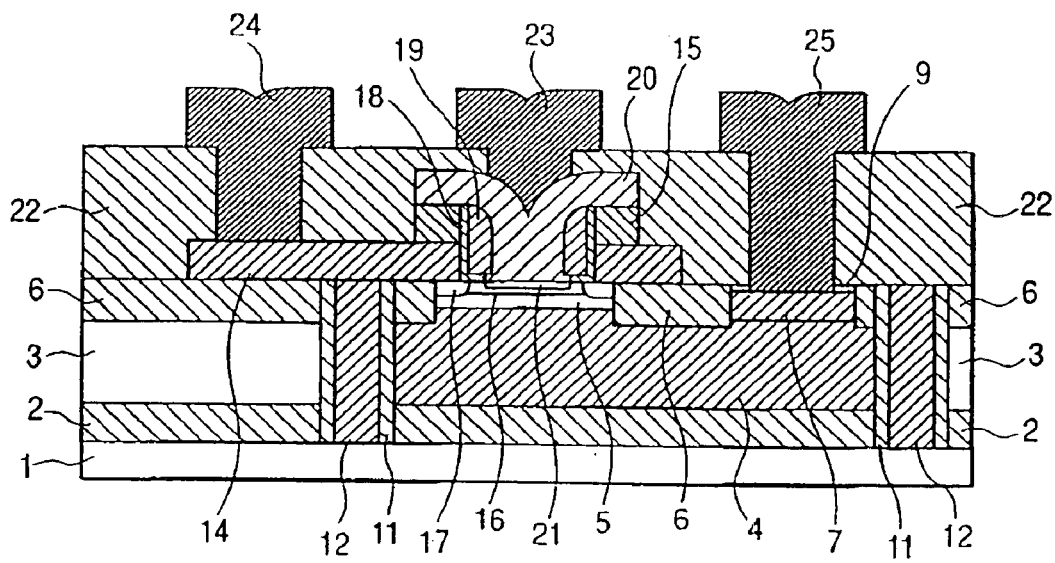
FIG. 9 is a cross sectional view of a semiconductor device of a second example in accordance with the present invention.

FIG. 9 shows a cross sectional view of a semiconductor device of a second example in accordance with the present invention.

In FIG. 9, like elements are given like reference numerals with FIG. 1, and a detailed description thereof is omitted for convenience in illustration (the same goes for the subsequent examples). The difference in configuration between the semiconductor device of this example and that of FIG. 1 is in that there is no silicon dioxide 13. This configuration is adopted for the purpose of improving the effect of heat radiation.

In the manufacturing method of this example, the same steps as those in Example 1 are followed until the single crystal silicon or polysilicon 12 is buried in the isolation groove of FIG. 5.

In the first example, the single crystal silicon or polysilicon 12 was oxidized to form the silicon dioxide 13. However, this oxidation is not performed in this example. Then, the procedure subsequent to the process of forming the p$^+$ polysilicon layer 14 is precisely the same as in the manufacturing method of the first example. The semiconductor device is thus manufactured to obtain the structure shown in FIG. 9.

This example is applicable in a normal high performance bipolar transistor formation process. This is attributable to the following fact. Namely, as described above, the diffusion depth of impurities into the silicon in the isolation groove is about 0.2 µm in terms of the high performance bipolar transistor formation process thermal capacity even when a polysilicon is used as the silicon in the isolation groove. Thus, it will not be deeper than the field oxide, and its effect also falls within a negligible range.

With this structure, the p$^+$ polysilicon layer 14 is in direct contact with the single crystal silicon or polysilicon 12. Accordingly, the effect of heat radiation is improved by 20% or more as compared with the first example. This allows operation even at high current. Further, as compared with the first example, the number of oxidation steps can be reduced to allow shortening of the manufacturing process.

EXAMPLE 3

Figure 10:
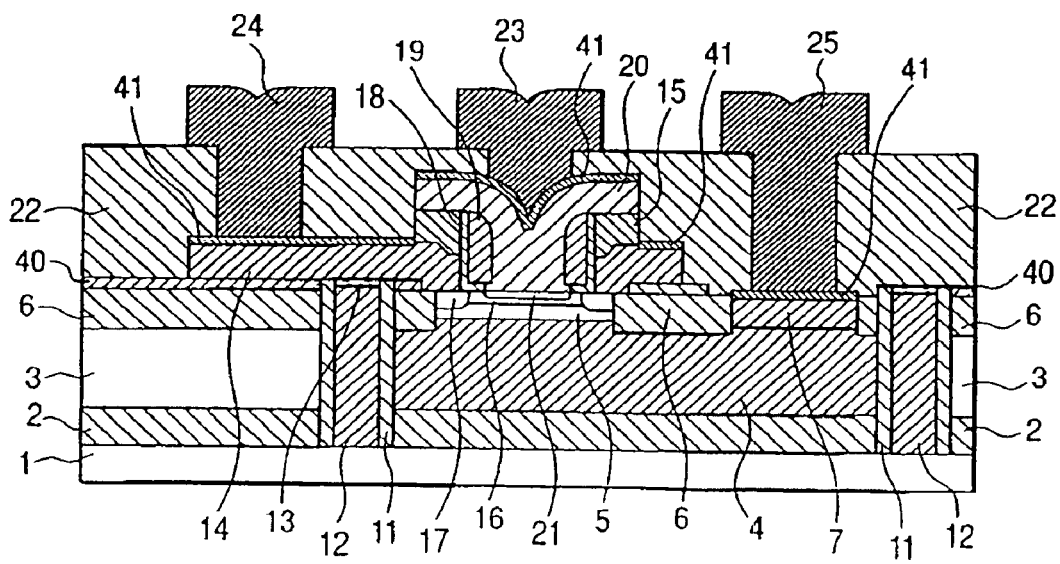
FIG. 10 is a cross sectional view of a semiconductor device of a third example in accordance with the present invention.
Figure 11:
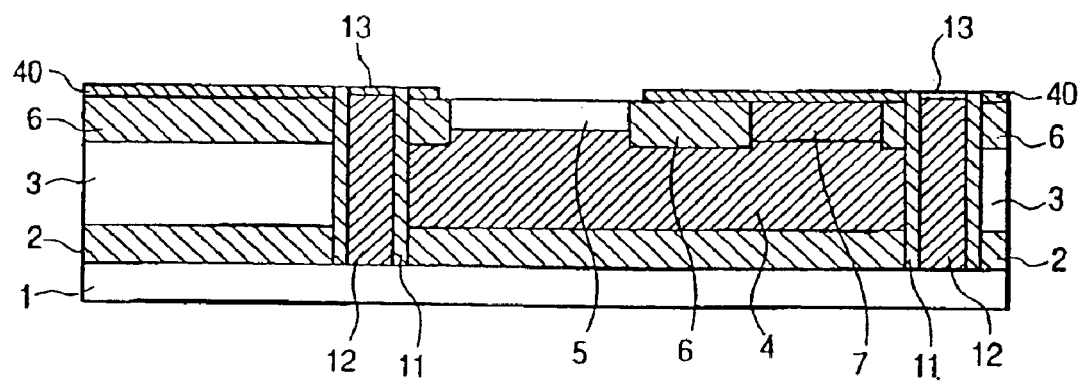
FIG. 11 is a cross sectional view of the semiconductor device shown in FIG. 9 in a first manufacturing step in a manufacturing process sequence thereof for showing a manufacturing method thereof step by step.
Figure 12:
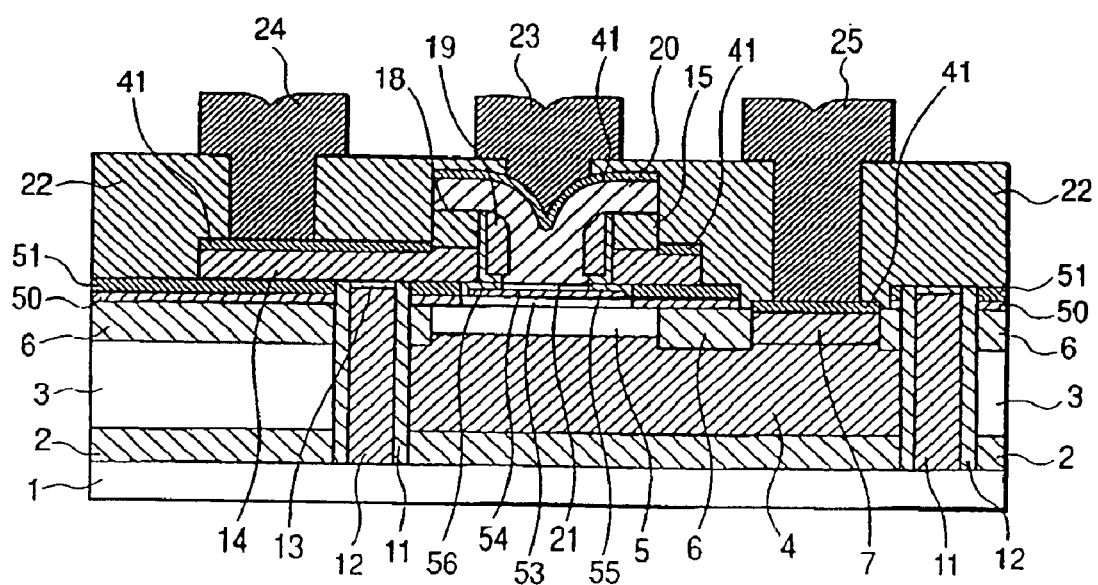
FIG. 12 is a cross sectional view of a semiconductor device of a fourth example in accordance with the present invention.
Figure 13:
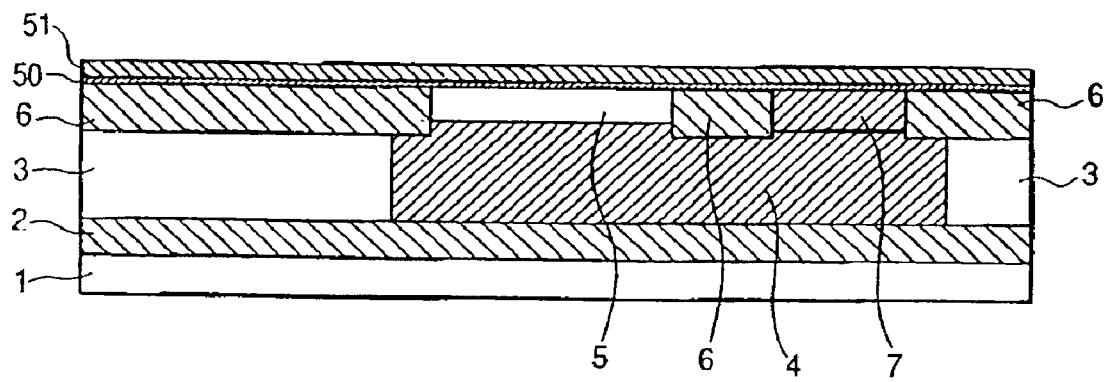
FIG. 13 is a cross sectional view of the semiconductor device shown in FIG. 12 in a first manufacturing step in a manufacturing process sequence thereof for showing a manufacturing method thereof step by step.

FIGS. 10 and 11 show a cross sectional view of a semiconductor device of a third example in accordance with the present invention, and a cross sectional view of the semiconductor device in a step of the manufacturing process. The difference in configuration between the semiconductor device of this example and that of FIG. 1 is in that there are provided a silicon dioxide represented by a reference numeral 40 and a Ti-silicide 41. When semiconductor devices such as a complementary MOS field effect transistor and a resistance using a polysilicon, and the bipolar transistor of this example are formed on the same wafer, the silicon dioxide 40 functions as a protective film thereof. The Ti-silicide 41 aims to reduce the contact resistance between respective metal electrodes of emitter, base, and collector, and their corresponding semiconductor layers electrically continuous therewith.

Below, a manufacturing method of the semiconductor device of this example will be described.

Figure 4:
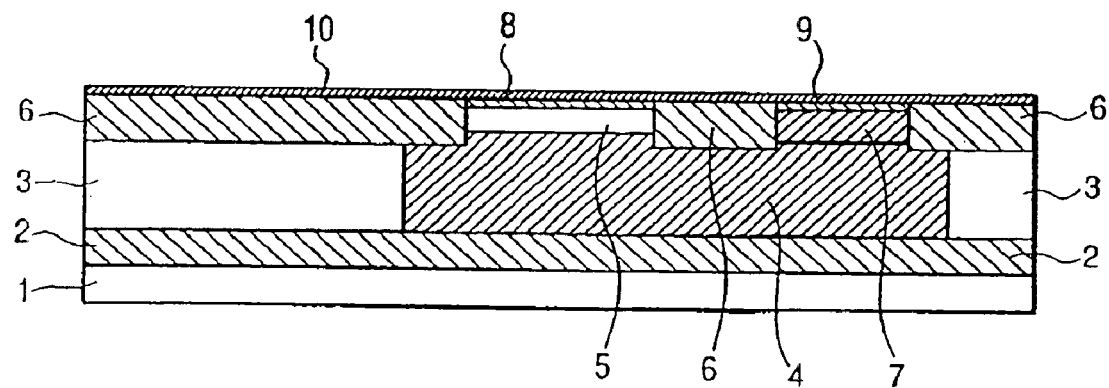
FIG. 4 is a cross sectional view of the semiconductor device shown in FIG. 1 in a first manufacturing step in a manufacturing process sequence thereof for showing a manufacturing method thereof step by step.

In the manufacturing method of this example, the same steps as those in Example 1 are followed until the collector contact layer 7 of FIG. 4 is formed. Subsequently, semiconductor devices-such as a complementary MOS transistor and a resistor using a polysilicon may also be formed. After formation of these semiconductor devices, a silicon dioxide 40 is formed on the entire surface.

Then, a groove is formed from the silicon dioxide 40 to the silicon substrate 1 by using a photoresist mask having an opening in groove form with a width of about 0.6 µm around the $n^+$ collector buried layer 4. Then, a silicon dioxide 11 with a thickness of about 0.2 µm is formed on the entire surface. Then, the silicon dioxide sidewall 11 is formed in the groove by dry etching. Further, a polysilicon 12 with a thickness of about 0.4 µm is formed on the entire surface. Then, the polysilicon exposed at the surface is removed by dry etching, so that the polysilicon 12 is buried in the groove. Alternatively, a single crystal silicon 12 may also be grown from the silicon substrate surface at the lower end of the groove by selective epitaxy to be buried in the groove. Herein, the single crystal silicon or polysilicon 12 is oxidized to form a silicon dioxide 13 having a film thickness of 10 nm or less. Herein, it is also possible that the silicon dioxide 13 is not formed as in the second example. Subsequently, by using a photoresist mask for opening intrinsic areas, the silicon dioxide 40 is processed by dry etching or wet etching. Consequently, the structure of FIG. 11 is obtained.

Figure 7:
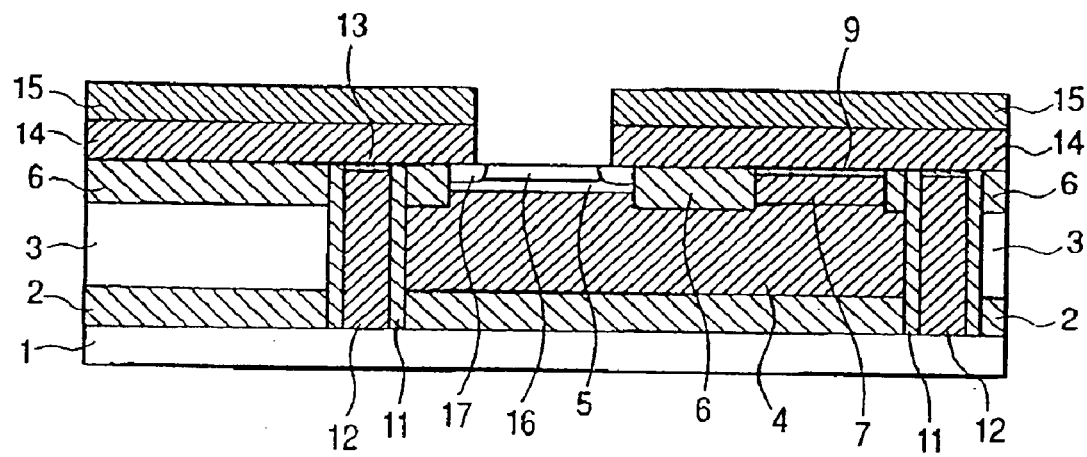
FIG. 7 is a cross sectional view of the semiconductor device in the subsequent step to the manufacturing step shown in FIG. 6.
Figure 8:
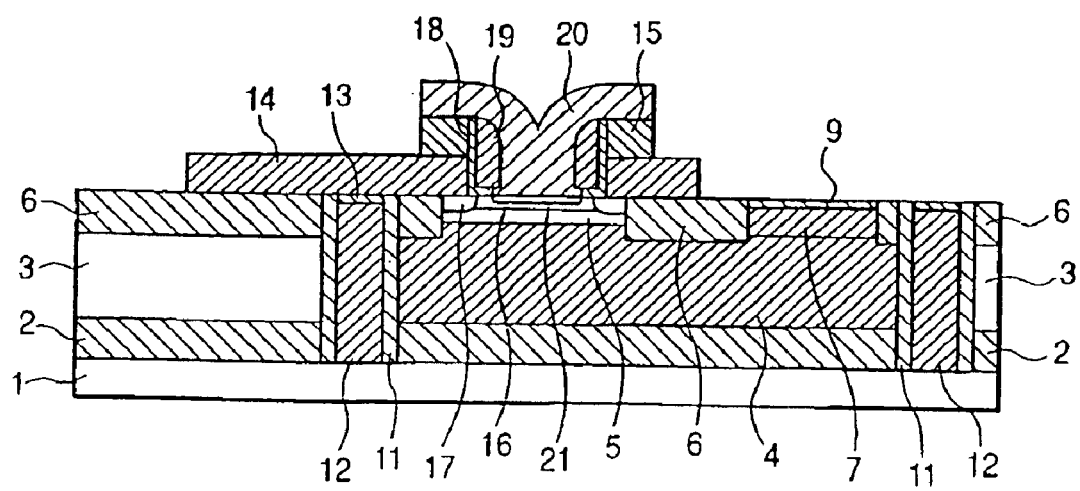
FIG. 8 is a cross sectional view of the semiconductor device in the subsequent step to the manufacturing step shown in FIG. 7.

The subsequent manufacturing process steps are the same as those of FIGS. 6 to 8 for illustrating the manufacturing process of the first example.

Then, the silicon dioxide 40 overlying the collector contact layer 5 is opened by using a photoresist mask by dry etching. Titanium is vapor deposited on the entire surface. Then, thermal processing is performed to form a Ti-silicide 41 on each surface of the polysilicon emitter 20, a part of the $p^+$ extrinsic base polysilicon electrode 14, and the collector contact layer 5. Whereas, titanium on other portions is removed. At this step, it is also possible to open the silicon dioxide 40 on other semiconductor device, and form a Ti-silicide.

Then, a silicon dioxide 22 is deposited and planarized. By using a photoresist mask having openings corresponding to an emitter, a base, and a collector, the silicon dioxide 22 is opened by dry etching.

Finally, tungsten is buried in the windows to form an emitter electrode 23, a base electrode 24, and a collector electrode 25. Consequently, the structure of the semiconductor device of this example shown in FIG. 10 can be obtained.

The semiconductor device of this example having such a structure can be merged with other semiconductor devices such as a high-speed bipolar transistor which has an SOI structure and a low parasitic capacitance, and is operable even at high current, a high performance complementary MOS field effect transistor which has an SOI structure and a low parasitic capacitance, and further a resistor on the same wafer. Therefore, it becomes possible to form a circuit configuration which has a more multifunction, operates at higher speed, and provides lower power consumption as compared with the first example.

Further, the contact resistances between the emitter metal electrode 23 and the polysilicon emitter 20, between the base metal electrode 24 and the $p^+$ extrinsic base polysilicon electrode 14, and between the collector metal electrode 25 and the collector contact layer 7 are $\frac{1}{10}$ as compared with those in the first example. Thus, they can be largely reduced. Accordingly, it is possible to reduce the parasitic resistance of the transistor.

EXAMPLE 4

FIGS. 12 to 17 show respective cross sectional views of a semiconductor device of a fourth example in accordance with the present invention, and the semiconductor device in manufacturing steps thereof. In this example, the intrinsic base is formed with silicon-germanium. A reference numeral 50 denotes a silicon dioxide, 51 a silicon nitride, 53 a single crystal silicon-germanium collector layer, 54 a $p^+$ single crystal silicon-germanium base layer, 55 a single crystal silicon layer, and 56 a $p^+$ polysilicon-germanium layer Other reference numerals are the same as those in the first example.

In the manufacturing method of this example, the same steps as those in the first example are followed until the collector contact layer 7 of FIG. 4 is formed. Subsequently, semiconductor devices such as a complementary MOS transistor and a resistor using a polysilicon may also be formed. After formation of these semiconductor devices, the silicon dioxide 50 and the silicon nitride 51 are formed on the entire surface, resulting in the structure shown in FIG. 13.

Figure 14:
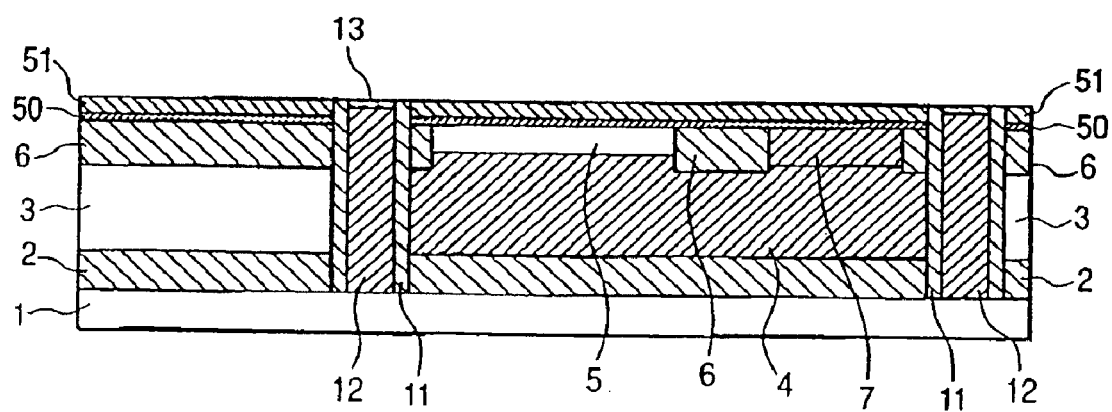
FIG. 14 is a cross sectional view of the semiconductor device in the subsequent step to the manufacturing step shown in FIG. 13.
Figure 15:
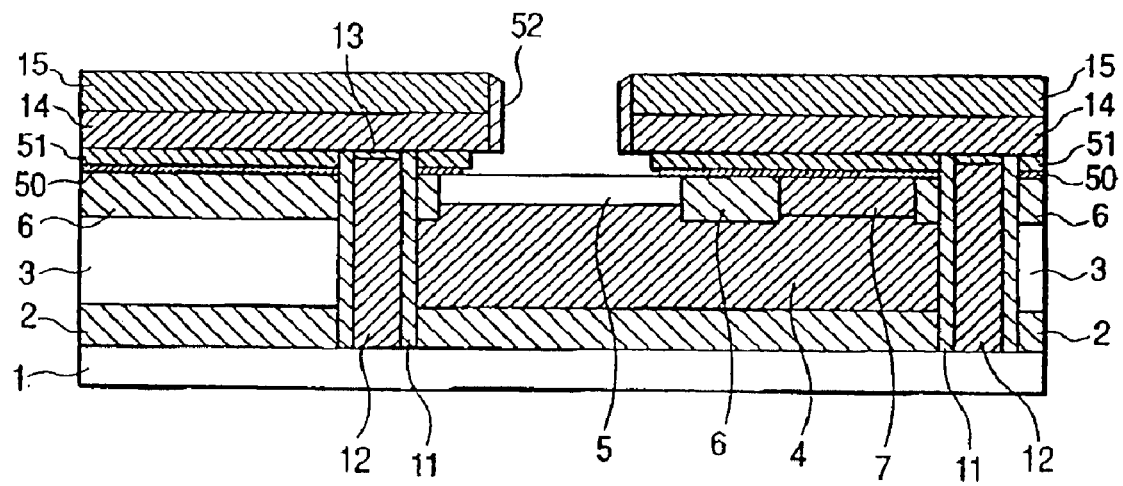
FIG. 15 is a cross sectional view of the semiconductor device in the subsequent step to the manufacturing step shown in FIG. 14.
Figure 16:
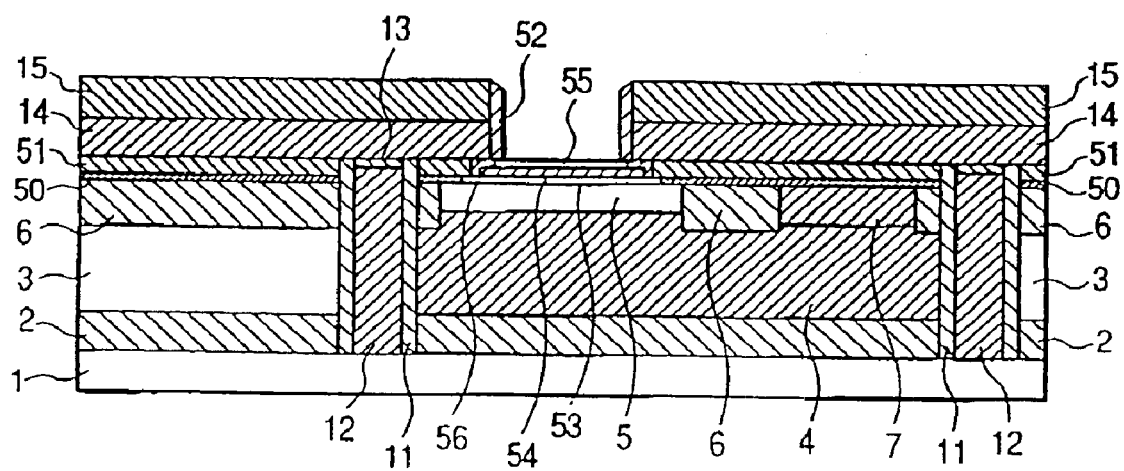
FIG. 16 is a cross sectional view of the semiconductor device in the subsequent step to the manufacturing step shown in FIG. 15.

Then, a groove is formed from the silicon nitride 51 to the silicon substrate 1 by using a photoresist mask having an opening in groove form with a width of about 0.6 µm around the $n^+$ collector buried layer 4. Then, a silicon dioxide 11 with a thickness of about 0.2 µm is formed on the entire surface. Then, a silicon dioxide sidewall 11 is formed in the groove by dry etching. Further, a polysilicon 12 with a thickness of about 0.4 µm is formed on the entire surface. Then, the polysilicon exposed at the surface is removed by dry etching, so that the polysilicon 12 is buried in the groove. Alternatively, a single crystal silicon 12 may also be grown from the silicon substrate surface at the lower end of the groove by using selective epitaxy to be buried in the groove. Herein, the single crystal silicon or polysilicon 12 is oxidized to form a silicon dioxide 13 having a film thickness of 10 nm or less. Consequently, the structure of FIG. 14 is obtained. Herein, it is also possible that the silicon dioxide 13 is not formed as in the second example.

Then, a $p^+$ polysilicon layer 14 with a film thickness of 0.2 µm is formed. The $p^+$ polysilicon layer 14 may also be formed by depositing a polysilicon, and then implanting p impurity ions thereinto. Further, after formation of a silicon dioxide 15 with a film thickness of 0.2 µm, by using a photoresist mask having an opening overlying the expected base area, the silicon dioxide 15 and the $p^+$ polysilicon layer 14 are opened by dry etching. A silicon dioxide 52 with a film thickness of 0.1 µm is deposited on the entire surface, and the silicon dioxide sidewall 52 is formed by dry etching. Further, the silicon nitride 51 is side-etched by a hot phosphoric acid to expose the underside surface of the $p^+$ polysilicon layer 14 by about 0.1 µm from its end. Thereafter, the silicon dioxide 50 is removed, resulting in the structure of FIG. 15.

Then, the single crystal silicon-germanium collector layer 53, the $p^+$ single crystal silicon-germanium layer 54, and the single crystal silicon layer 55 are successively formed by selective epitaxy. Simultaneously, the $p^+$ polysilicon-germanium graft base 56 is formed from the $p^+$ polysilicon layer 14 and the silicon nitride 51. Then, the $p^+$ polysilicon-germanium graft base 56 and the $p^+$ single crystal silicon-germanium layer 54 are bonded to each other. Consequently, the structure shown in FIG. 16 can be obtained.

Then, the silicon dioxide sidewall 52 is removed, and then a silicon dioxide 18 having a film thickness of 30 nm, and an n+ polysilicon 19 having a film thickness of 0.1 μm are successively deposited. Then, the n+ polysilicon sidewall 19 is formed by dry etching. The silicon dioxide 18 is etched by a hydrofluoric-acid until the p+ single crystal silicon-germanium layer 54 or the single crystal layer 55 corresponding to the intrinsic base layer 16 shown in FIG. 1 or the like is exposed. The n+ polysilicon 20 having a film thickness of 0.2 μm is then deposited thereon. It is dry-etched by using a resist mask having a pattern covering the emitter window to form the polysilicon emitter 20. Then, thermal processing is performed at 900° C. for about 30 seconds to diffuse n-impurities from the polysilicon emitter 20 into the surface of the single crystal silicon layer 55, thereby forming an emitter area 21.

Figure 17:
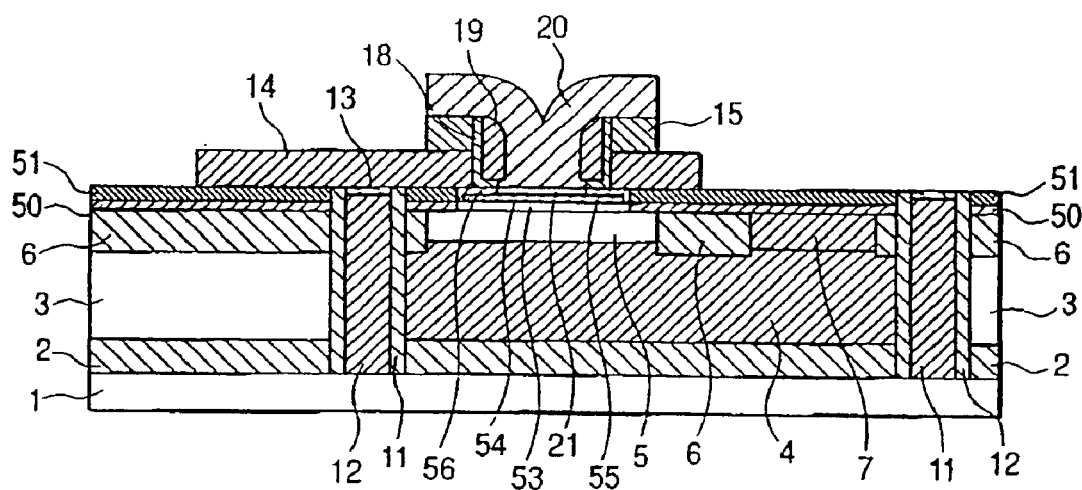
FIG. 17 is a cross sectional view of the semiconductor device in the subsequent step to the manufacturing step shown in FIG. 16.
Figure 18:
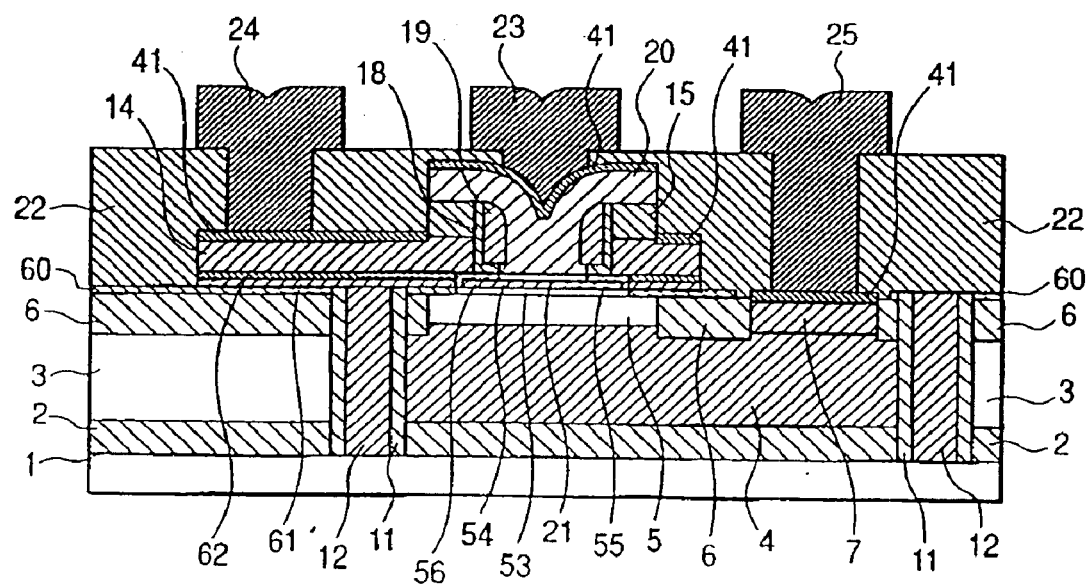
FIG. 18 is a cross sectional view of a semiconductor device of a fifth example in accordance with the present invention.
Figure 19:
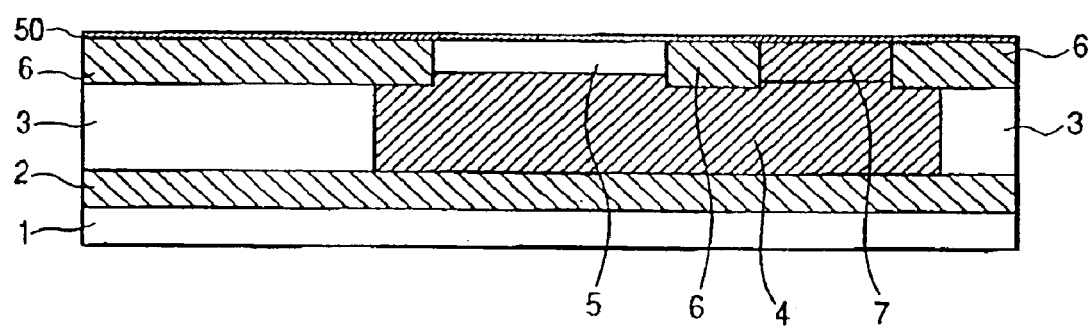
FIG. 19 is a cross sectional view of the semiconductor device shown in FIG. 18 in a first manufacturing step in a manufacturing process sequence thereof for showing a manufacturing method thereof step by step.

The manufacturing step of FIG. 17 and subsequent steps are the same as those in the third example. By these steps, the structure of the semiconductor device of this example shown in FIG. 12 can be obtained.

For the semiconductor device of this example having such a structure, since the intrinsic base is formed by selective epitaxy of single crystal silicon-germanium, it is possible to reduce the base width and achieve a higher concentration of impurities. Further, since the base-collector junction area can be reduced, it becomes possible to form a two-fold or more higher speed and low power consumption bipolar transistor as compared with the first to third examples. Further, since it is possible to protect other semiconductor devices by the silicon dioxide 50 and the silicon nitride 51, it is possible to merge other semiconductor devices such as a complementary MOS field effect transistor of an SOI structure and a resistance using a polysilicon therewith on the same wafer.

EXAMPLE 5

FIGS. 18 to 23 show respective cross sectional views of a semiconductor device of a fifth example in accordance with the present invention, and the semiconductor device in manufacturing steps thereof. In this example, the intrinsic base is formed with silicon-germanium in the same manner as in the fourth example. A reference numeral 60 denotes a silicon dioxide, 61 a single crystal silicon layer, and 62 a silicon nitride. Other reference numerals are the same as those in the fourth example.

In the manufacturing method of this example, the same steps as those in Example 1 are followed until the collector contact layer 7 of FIG. 4 is formed. Subsequently, semiconductor devices such as a complementary MOS transistor and a resistor using a polysilicon may also be formed. After formation of these semiconductor devices, a silicon dioxide 60 is formed on the entire surface, resulting in the structure shown in FIG. 19.

Then, a groove is formed from the silicon dioxide 60 to the silicon substrate 1 by using a photoresist mask having an opening in groove form with a width of about 0.6 μm around the n+ collector buried layer 4. Then, a silicon dioxide 11 with a thickness of about 0.2 μm is formed on the entire surface. Then, the silicon dioxide side wall 11 is formed in the groove by dry etching. Further, a polysilicon 12 with a thickness of about 0.4 μm is formed on the entire surface. Then, the polysilicon exposed at the surface is removed by dry etching, so that the polysilicon 12 is buried in the groove. Alternatively, a single crystal silicon 12 may also be grown from the silicon substrate surface at the lower end of the groove by selective epitaxy to be buried in the groove.

Figure 20:
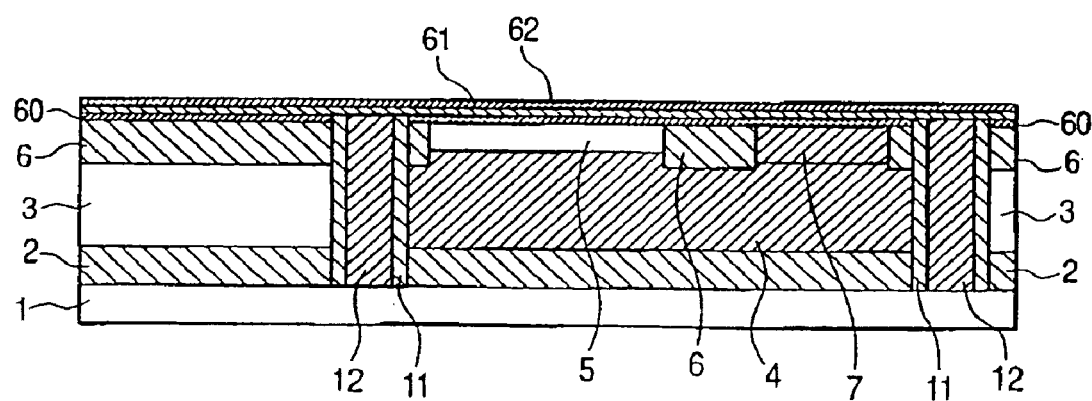
FIG. 20 is a cross sectional view of the semiconductor device in the subsequent step to the manufacturing step shown in FIG. 19.
Figure 21:
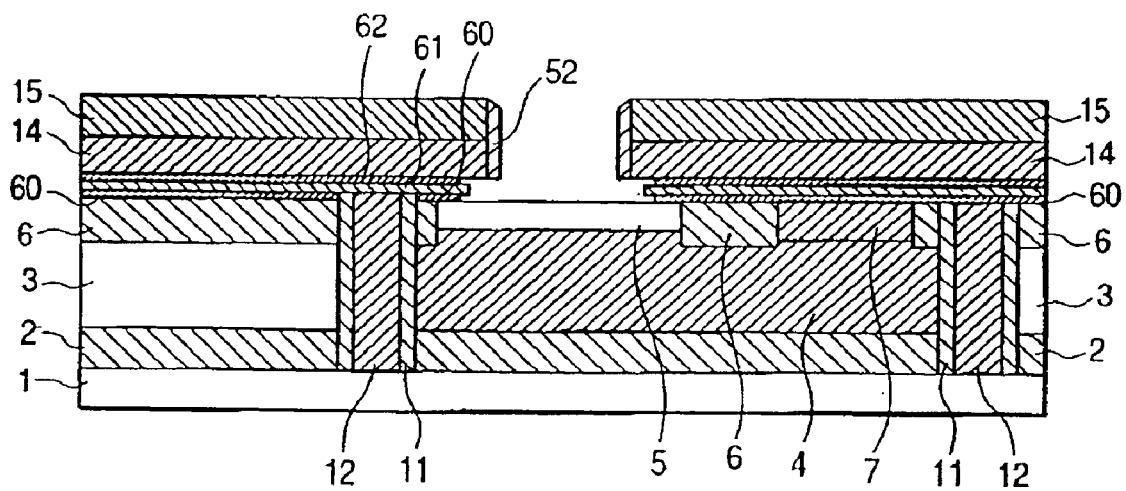
FIG. 21 is a cross sectional view of the semiconductor device in the subsequent step to the manufacturing step shown in FIG. 20.
Figure 22:
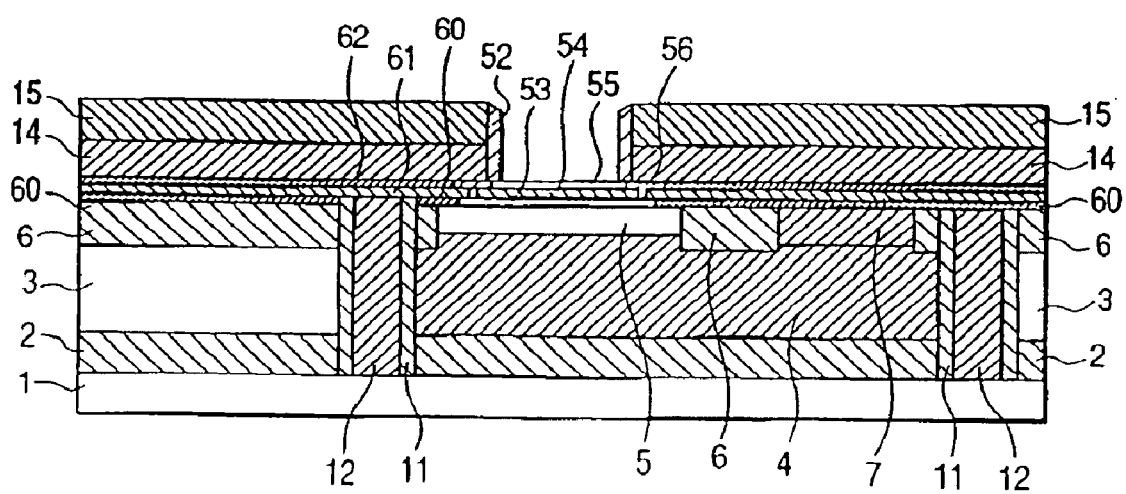
FIG. 22 is a cross sectional view of the semiconductor device in the subsequent step to the manufacturing step shown in FIG. 21.

Subsequently, a polysilicon layer 61 and a silicon nitride 62 each having a film thickness of about 30 nm are deposited thereon, resulting in the structure of FIG. 20.

Then, a p+ polysilicon layer 14 with a film thickness of 0.2 μm is deposited thereon. The p+ polysilicon layer 14 may also be formed by depositing the polysilicon, and then implanting p impurity ions thereinto.

Further, after forming a silicon dioxide 15 having a film thickness of 0.2 μm, by using a photoresist mask having an opening overlying the expected base area, the silicon dioxide 15 and the p+ polysilicon layer 14 are opened by dry etching. A silicon dioxide 52 with a film thickness of 0.1 μm is deposited on the entire surface, and the silicon dioxide sidewall 52 is formed by dry etching. At this step, etching is performed to the silicon nitride 62. Thereafter, the polysilicon layer 61 is side-etched by about 0.2 μm, and the silicon dioxide 60 is removed by wet etching with a hydrofluoric-acid. Further, the silicon nitride 62 is etched by a hot phosphoric acid to expose the underside surface of the p+ polysilicon layer 14 by about 0.1 μm from its end, resulting in the structure of FIG. 21.

Then, the single crystal silicon-germanium layer 53, the p+ single crystal silicon-germanium layer 54, and the single crystal silicon layer 55 are successively formed by selective epitaxy. Simultaneously, the p+ polysilicon-germanium graft base 56 is formed from the p+ polysilicon layer 14, the polysilicon 61, and the silicon nitride 62. Then, the p+ polysilicon-germanium graft base 56 and the p+ single crystal silicon-germanium layer 54 are bonded to each other. Consequently, the structure shown in FIG. 22 can be obtained.

Then, the silicon dioxide sidewall 52 is removed, and then a silicon dioxide 18 having a film thickness of 30 nm, and an n+ polysilicon 19 having a film thickness of 0.1 μm are successively deposited. Then, the n+ polysilicon sidewall 19 is formed by dry etching. The silicon dioxide 18 is etched by a hydrofluoric-acid until the p+ single crystal silicon-germanium layer 54 or the single crystal silicon layer 55 corresponding to the intrinsic base layer 16 shown in FIG. 1 or the like is exposed. An n+ polysilicon 20 having a film thickness of 0.2 μm is then deposited thereon. It is dry-etched by using a resist mask having a pattern covering the emitter window to form the polysilicon emitter 20. Then, thermal processing is performed at 900° C. for about 30 seconds to diffuse n impurities from the polysilicon emitter 20 into the surface of the single crystal silicon layer 55, thereby forming an emitter area 21.

Figure 23:
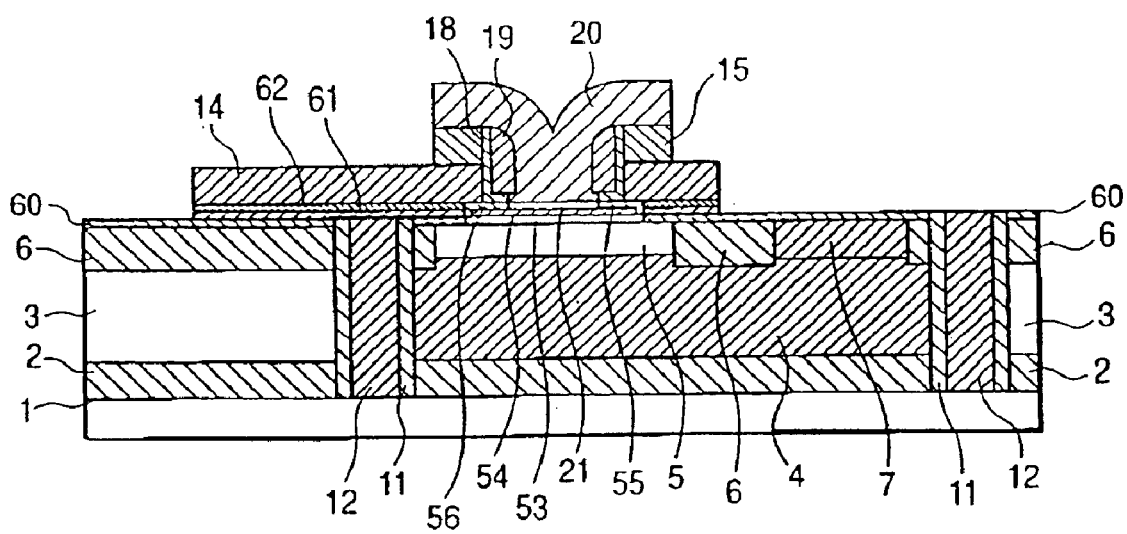
FIG. 23 is a cross sectional view of the semiconductor device in the subsequent step to the manufacturing step shown in FIG. 22.

The manufacturing step of FIG. 23 and subsequent steps are the same as those in the fourth example. By these steps, the structure of the semiconductor device of this example shown in FIG. 18 can be obtained.

For the semiconductor device of this example having such a structure, since the intrinsic base is formed by selective epitaxy of single crystal silicon-germanium, it becomes possible to form the same high speed and low power consumption bipolar transistor as that of the fourth example. Further, use of the polysilicon 61 prevents occurrence of cavities which are likely to be formed in the p+ polysilicon-germanium graft base 56 in the fourth example. Accordingly, it becomes possible to reduce the variations in the transistor characteristics, and improve the reliability.

EXAMPLE 6

Figure 24:
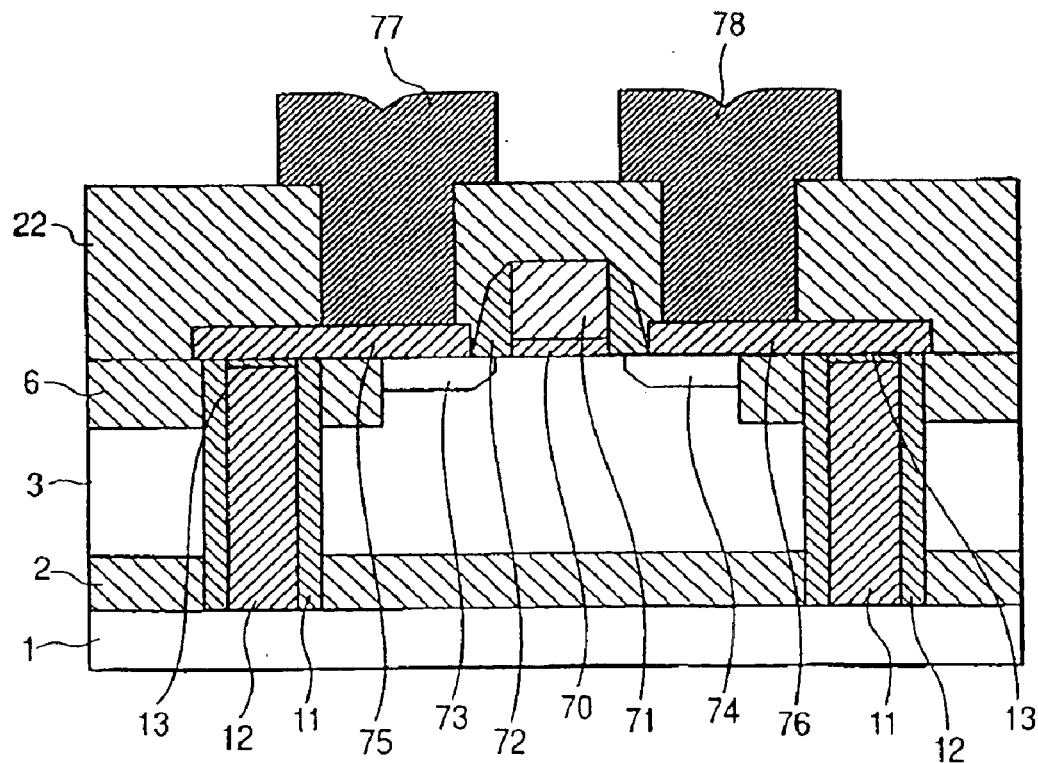
FIG. 24 is a cross sectional view of a semiconductor device of a sixth example in accordance with the present invention.

FIG. 24 shows a cross sectional view of a semiconductor device of a sixth example in accordance with the present invention. This example pertains to an MOS field effect transistor. A reference numeral 70 denotes a gate oxide, 71 a gate, 72 a silicon dioxide sidewall, 73 and 74 respectively a source/drain, 75 and 76 respectively source/drain polysilicon semiconductor electrodes, and 77 and 78 respectively source/drain metal electrodes. Other reference numerals are the same as those in the first example. Incidentally, it is also acceptable that there is no silicon dioxide 13.

For the semiconductor device of this example having such a structure, heat is radiated from the source or drain 73 or 74 to the source/drain polysilicon semiconductor electrode 75 or 76, and further radiated through the single crystal silicon or polysilicon 12 in the groove to the silicon substrate 1. With this structure, heat radiation becomes two times or more effective than the prior-art structure to allow a higher current operation.

EXAMPLE 7

Figure 25:
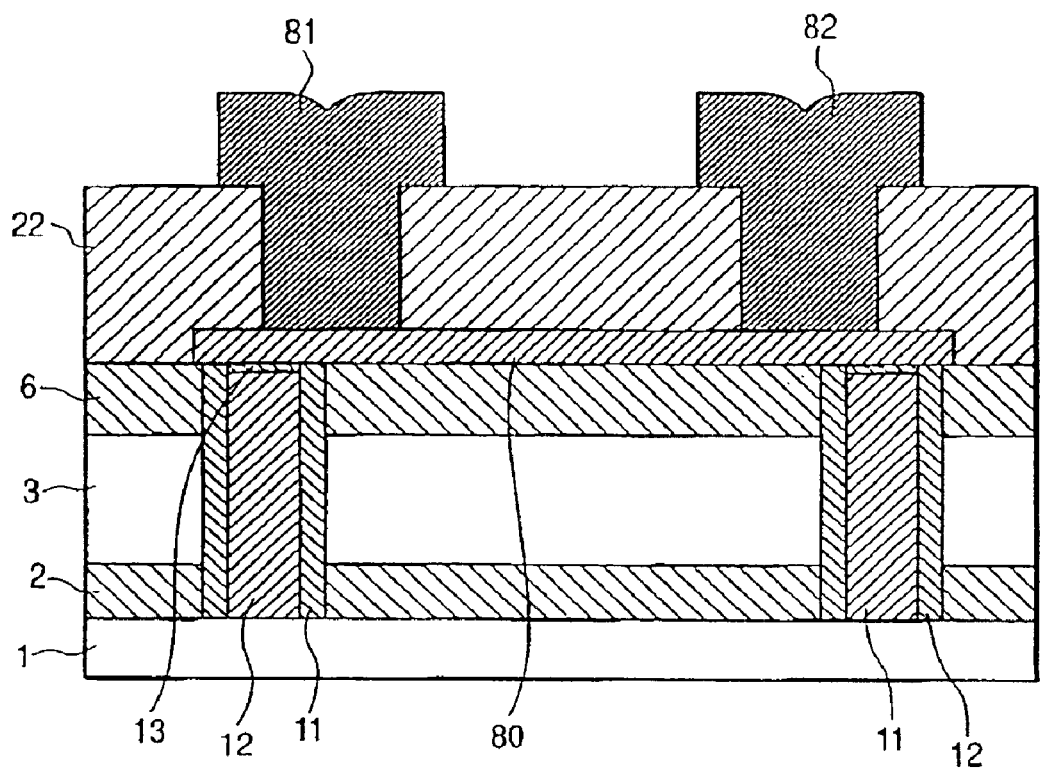
FIG. 25 is a cross sectional view of a semiconductor device of a seventh example in accordance with the present invention.

FIG. 25 shows a cross sectional view of a semiconductor device of a seventh example in accordance with the present invention. This example pertains to a polysilicon resistor. A reference numeral 80 denotes a polysilicon resistor, and 81 and 82 metal electrodes. Other reference numerals are the same as those in the first example. Incidentally, it is also acceptable that there is no silicon dioxide 13.

For the semiconductor device of this example having such a structure, heat is radiated from the polysilicon resistor 80 through the single crystal silicon or polysilicon 12 in the groove to the silicon substrate 1. With this structure, heat radiation becomes two times or more effective than the prior-art structure to allow the device to be used at a higher current density. Further, the groove may also be located at a region underlying the polysilicon resistor 80 within its allowable machining dimensions. As a result, the effect of heat radiation is further increased.

EXAMPLE 8

Figure 26:
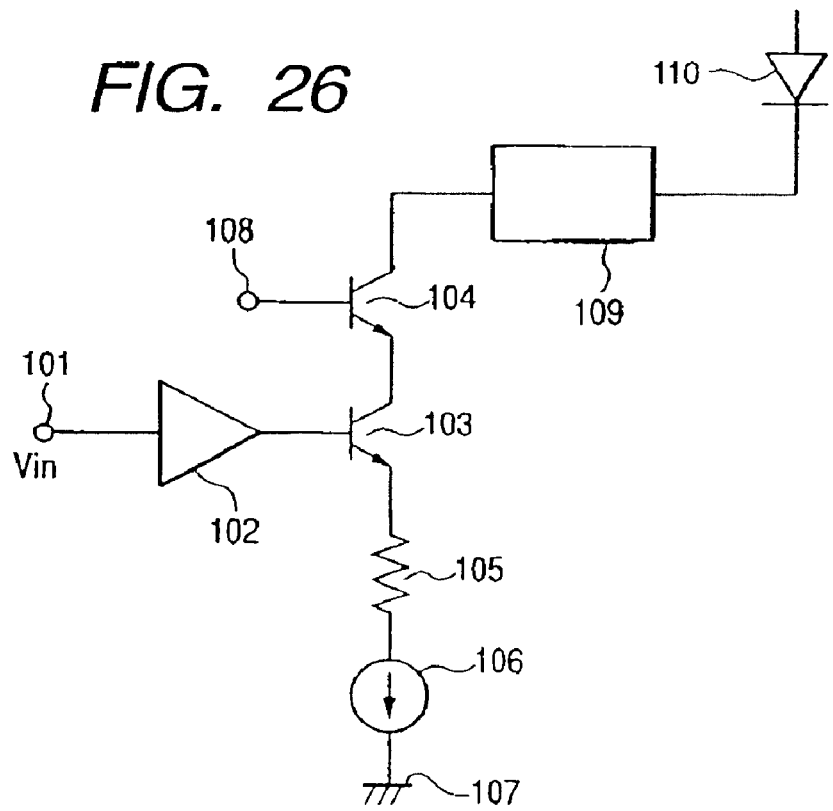
FIG. 26 is a circuit diagram for showing a semiconductor device of an eighth example in accordance with the present invention, wherein the semiconductor device is applied to a laser diode modulator driver circuit of an optical transmission system.

FIG. 26 is a diagram for showing a circuit configuration of a driver of a laser diode modulator in an optical transmission system, which is an eighth example. This example shows the circuit configuration capable of achieving a higher performance by using the semiconductor devices in accordance with any aspect of the present invention described in Examples 1 to 7. As is well known, the optical transmission system requires high speed transmission of 10 Gbps or more, and the modulator driver thereof is required to operate at high speed.

In this example, reference numerals 103 and 104 denote the semiconductor devices manufactured in accordance-with any of Examples 1 to 7, 105 a resistor, 106 a current source, 102 an amplifier, 101 an input terminal, 107 a ground terminal, 108 a terminal of input bias voltage of the semiconductor device 101, 109 a modulator, and 110 a laser diode.

A signal of 10 Gbps or more is inputted from the front stage circuit to the input terminal 101, and amplified up to the bias voltage of the semiconductor device 103 at the amplifier 102. This signal is further amplified through the bias input of the semiconductor device 103 to obtain an amplified output. The modulator 109 is driven by the output voltage to further modulate the laser diode 110, so that an optical signal is oscillated.

It is noted that the amplifier 102 and the current source 106 may also be configured by using the semiconductor devices manufactured in accordance with any of Examples 1 to 7 of the present invention.

Apparent from the foregoing examples, according to the semiconductor device in accordance with the present invention, heat radiation becomes two times or more effective than the prior-art semiconductor device. Particularly, for a bipolar transistor, it is possible to improve the effect of heat radiation without increasing the substrate capacitance. This provides a transistor having high reliability and operating at high speed, and further allows the operation of a driver of a laser diode modulator of an optical transmission system operating at 10 Gpbs or more using this transistor.

The foregoing invention has been described in terms of preferred embodiments. However, those skilled, in the art will recognize that many variations of such embodiments exist. Such variations are intended to be within the scope of the present invention and the appended claims.

What is claimed is:

1. The semiconductor device to provide thermal transfer from a base layer to a substrate,
   wherein a base electrode is included in a path of the thermal transfer from said base layer through said substrate,
   wherein said base electrode is electrically connected to said base layer and electrically insulated from said substrate, wherein a single crystal silicon area is included between said base electrode and said substrate, and
   wherein the base electrode and the single crystal silicon area are in contact with each other, and the resistivity of the single crystal silicon area is $10^3$ Ωcm or more.

2. The semiconductor device to provide thermal transfer from a base layer to a substrate wherein a base electrode is included in a path of the thermal transfer from said base layer through said substrate,
   wherein said base electrode is electrically connected to said base layer and electrically insulated from said substrate,
   wherein a polysilicon area is included between said base electrode and said substrate, and
   wherein the base electrode and the polysilicon area are in contact with each other, and the resistivity of the polysilicon area is $10^3$ Ωcm or more.

3. A semiconductor device providing a thermal transfer from a base layer to a substrate comprising:
   a semiconductor substrate;
   a base electrode electrically connected to a base layer and electrically insulated from said substrate; and
   a trench provided between said base electrode and said substrate having silicon buried therein;
   said base electrode being in direct thermal connection to said buried silicon whereby said base electrode and said buried silicon form a path of thermal transfer from said base layer through said buried silicon to said substrate, so that the heat generated in the base layer is transferred through the base electrode to the substrate.

4. The semiconductor device according to claim 3, wherein an electrical insulating layer is included between said base electrode and said substrate.

5. The semiconductor device according to claim 4, wherein the thickness of the electrical insulating layer is 10 nm or less.

6. The semiconductor device according to claim 3, wherein said silicon comprises a single crystal silicon area included between said base electrode and said substrate.

7. The semiconductor device according to claim 4, wherein a single crystal silicon area is included between said electrical insulating layer and said substrate.

8. The semiconductor device according to claim 5, wherein a single crystal silicon area is included between said electrical insulating layer and said substrate.

9. The semiconductor device according to claim 3, wherein said silicon comprises a polysilicon area included between said base electrode and said substrate.

10. The semiconductor device according to claim 4, wherein a polysilicon area is included between said electrical insulating layer and said substrate.

11. The semiconductor device according to claim 5, wherein a polysilicon area is included between said electrical insulating layer and said substrate.

12. A semiconductor device according to claim 3, wherein said base electrode extends over an insulation region, interposed between said base layer and said buried silicon in said trench, such that said base electrode connects said base region with said buried silicon as part of said path of thermal transfer extending over said insulation region, wherein said insulation region is not interposed between said base electrode and said buried silicon in said trench.

13. A semiconductor device providing a thermal transfer from a base layer to a substrate comprising:

a base electrode electrically connected to a base layer and electrically insulated form said substrate; and a trench provided between said base electrode and said substrate having silicon buried therein;

said base electrode being in direct thermal connection to said buried silicon whereby said base electrode and said buried silicon form a path of thermal transfer from aid base layer through said buried silicon to said substrate, so that the heat generated in the base layer is transferred through the base electrode to the substrate, wherein said path of thermal transfer from the base layer to the substrate extends upwardly from the base layer into the base electrode and then downward through the buried silicon in the trench to the substrate.

14. A semiconductor device according to claim 3, wherein the base layer is electrically isolated from the substrate by an electrical insulation layer located between the base electrode and the buried silicon, wherein said electrical insulation layer has a thickness sufficient to electrically isolate the base electrode from the substrate while providing the direct thermal connection between the base electrode and the buried silicon.

15. A semiconductor device according to claim 14, wherein said electrical insulation layer is comprised of silicon dioxide.

16. A semiconductor device according to claim 15, wherein said electrical insulation layer has a thickness of about 10 nm.

17. A semiconductor device according to claim 13, wherein the base layer is electrically isolated from the substrate by an electrical insulation layer located between the base electrode and the buried silicon, wherein said electrical insulation layer has a thickness sufficient to electrically isolate the base electrode from the substrate while providing the direct thermal connection between the base electrode and the buried silicon.

18. A semiconductor device according to claim 17, wherein said electrical insulation layer is comprised of silicon dioxide.

19. A semiconductor device according to claim 18, wherein said electrical insulation layer has a thickness of about 10 nm.

* * * * *